US012641839B2

(12) United States Patent
Li et al.

(10) Patent No.: US 12,641,839 B2
(45) Date of Patent: May 26, 2026

(54) SUPER-β BIPOLAR JUNCTION TRANSISTOR AND MANUFACTURING METHOD THEREFOR

(71) Applicant: CSMC TECHNOLOGIES FAB2 CO., LTD., Wuxi (CN)

(72) Inventors: Yongshun Li, Wuxi (CN); Huajun Jin, Wuxi (CN); Liang Song, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 393 days.

(21) Appl. No.: 18/254,986

(22) PCT Filed: Jul. 22, 2022

(86) PCT No.: PCT/CN2022/107260
§ 371 (c)(1),
(2) Date: May 30, 2023

(87) PCT Pub. No.: WO2023/005819
PCT Pub. Date: Feb. 2, 2023

(65) Prior Publication Data
US 2024/0006477 A1      Jan. 4, 2024

(30) Foreign Application Priority Data

Jul. 28, 2021      (CN) ......................... 202110858844.X

(51) Int. Cl.
*H10D 62/10*          (2025.01)
*H10D 62/13*          (2025.01)
(Continued)

(52) U.S. Cl.
CPC ......... *H10D 62/111* (2025.01); *H10D 62/133* (2025.01); *H10D 62/137* (2025.01); *H10D 62/393* (2025.01); *H10D 62/60* (2025.01)

(58) Field of Classification Search
CPC .. H10D 62/133; H10D 62/137; H10D 62/393; H10D 62/60; H10D 10/60;
(Continued)

(56) References Cited

U.S. PATENT DOCUMENTS

| | | | | |
|---|---|---|---|---|
| 6,495,904 B1* | 12/2002 | Kitch | ................... | H10D 10/051 |
| | | | | 257/E21.375 |
| 2007/0052066 A1* | 3/2007 | Beasom | ............... | H10D 10/421 |
| | | | | 257/E29.034 |

(Continued)

FOREIGN PATENT DOCUMENTS

| | | |
|---|---|---|
| CN | 1722460 | 1/2006 |
| CN | 103094103 | 5/2013 |

(Continued)

OTHER PUBLICATIONS

PCT International Search Report and Written Opinion (w/ English translations) for corresponding PCT Application No. PCT/CN2022/107260, mailed Oct. 26, 2022, 10 pages.
Office Action (with English translation) received in corresponding Application No. 202110858844.X, dated Jun. 27, 2025, 22 pages.
Japanese Office Action (w/ English translation) for corresponding Application No. 2023-547839, dated Oct. 22, 2024, 7 pages.

*Primary Examiner* — Shahed Ahmed
(74) *Attorney, Agent, or Firm* — Dority & Manning, PA

(57)          ABSTRACT
A manufacturing method for a super-β bipolar junction transistor includes providing a substrate, and forming a first conductive type isolation buried layer and a first conductive type doped layer based on the substrate. The isolation buried layer is located at a bottom of the doped layer. The method also includes forming a second conductive type base region in the doped layer and forming a second conductive type doped island on a peripheral side of the base region. A doping concentration of the doped island is greater than that of the base region. Additionally, the method includes forming a first conductive type collector region in the doped layer, and the collector region is spaced from the base
(Continued)

region. Further, the method includes forming a first conductive type emitter region in the base region.

16 Claims, 3 Drawing Sheets

(51) Int. Cl.
    *H10D 62/17*         (2025.01)
    *H10D 62/60*         (2025.01)

(58) Field of Classification Search
    CPC .. H10D 10/041; H10D 10/061; H10D 10/311;
        H10D 62/184; H10D 10/00–891; H10D
        84/0107–0109; H10D 62/109–111; H10D
        62/106–107; H10D 89/711–713
    See application file for complete search history.

(56)               References Cited

U.S. PATENT DOCUMENTS

| | | |
|---|---|---|
| 2010/0327280 A1 | 12/2010 | Joseph et al. |
| 2017/0345902 A1* | 11/2017 | Chen .................... H10D 62/184 |

FOREIGN PATENT DOCUMENTS

| | | |
|---|---|---|
| CN | 103456628 | 12/2013 |
| CN | 106206697 | 12/2016 |
| CN | 109065452 A | 12/2018 |
| JP | H05102171 | 4/1993 |
| JP | H05251462 A | 9/1993 |
| JP | H11154680 A | 6/1999 |
| JP | 2012532449 A | 12/2012 |

* cited by examiner

SUPER-β BIPOLAR JUNCTION TRANSISTOR AND MANUFACTURING METHOD THEREFOR

CROSS-REFERENCE TO RELATED APPLICATIONS

The present application is a national stage application of PCT international application No. PCT/CN2022/107260 filed on Jul. 22, 2022, which claims priority to Chinese patent application No. 202110858844.X filed with the Chinese Patent Office on Jul. 28, 2021, entitled "SUPER-β TRANSISTOR TRIODE AND MANUFACTURING METHOD THEREFOR", the entire contents of which are incorporated by reference.

TECHNICAL FIELD

The present disclosure relates to the semiconductor device design and manufacturing technology, and in particular, to a super-β bipolar junction transistor and a method for manufacturing a super-β bipolar junction transistor.

BACKGROUND

A bipolar junction transistor has two N-type regions surrounding a P-type region. One of the N-type regions is the collector, the other of the N-type regions is the emitter, and the P-type region is the base. The bipolar junction transistor can operate in different modes based on different voltage bias modes. The bipolar junction transistor operates in a cutoff mode when both the emitter-base junction and the collector-base junction are reverse biased. The bipolar junction transistor operates in an active mode when the emitter-base junction is forward biased and the collector-base junction is reverse biased. The bipolar junction transistor operates in a saturation mode when both the emitter-base junction and the collector-base junction are forward biased. The active mode is used when the bipolar junction transistor serves as an amplifier, and the cutoff mode and the saturation mode are used when the bipolar junction transistor serves as a switch. A common emitter current gain, often referred to as β or HFE, is a parameter of the bipolar junction transistor. In the active mode, the common emitter current gain is a ratio of the collector current to the base current.

SUMMARY

In view of the above disadvantages of the prior art, a purpose of the present disclosure is to provide a super-β bipolar junction transistor and a manufacturing method therefor to solve the problem of the great risk of the base region punch-through of the bipolar junction transistor structure in the prior art.

In order to achieve the above and other related purposes, the present disclosure provides a method for manufacturing a super-β bipolar junction transistor. The method includes the following steps. Providing a substrate, and forming a first conductive type isolation buried layer and a first conductive type doped layer based on the substrate. The isolation buried layer is located at a bottom of the doped layer. Forming a second conductive type base region in the doped layer. Forming a second conductive type doped island on a peripheral side of the base region. The doping concentration of the doped island is greater than that of the base region. Forming a first conductive type collector region in the doped layer. The collector region is spaced from the base region. Forming a first conductive type emitter region in the base region.

In an embodiment, the doping concentration of the base region ranges from $5e17 \text{ cm}^{-3}$ to $8e17 \text{ cm}^{-3}$, and the doping concentration of the doped island is greater than or equal to $5e18 \text{ cm}^{-3}$.

In an embodiment, a doping concentration of the collector region is greater than that of the doped layer, and a doping concentration of the isolation buried layer is greater than that of the doped layer.

In an embodiment, an injection junction depth of the base region is less than or equal to that of the doped island.

In an embodiment, the method further includes forming a second conductive type contact region in the base region, and forming a first conductive type contact region in the collector region. A doping concentration of the second conductive type contact region is greater than that of the doped island, and a doping concentration of the first conductive type contact region is greater than that of the collector region.

In an embodiment, a bottom of the collector region is connected to at least a portion of the isolation buried layer, and a bottom of the doped island is connected to at least a portion of the isolation buried layer.

In an embodiment, the forming the first conductive type isolation buried layer and the first conductive type doped layer based on the substrate includes: forming the isolation buried layer in the substrate by an ion implantation process, and forming the doped layer in a surface layer of the substrate by an ion implantation process.

In an embodiment, the forming the first conductive type isolation buried layer and the first conductive type doped layer based on the substrate includes forming the isolation buried layer in a surface layer of the substrate by an ion implantation process and forming the doped layer on the substrate by an epitaxial process.

The present disclosure further provides a super-β bipolar junction transistor including a substrate, a first conductive type isolation buried layer, a first conductive type doped layer, a second conductive type base region, a second conductive type doped island, a first conductive type collector region, and a first conductive type emitter region. The first conductive type isolation buried layer is formed in the substrate. The first conductive type doped layer is formed in a surface layer of the substrate or on the substrate, and the isolation buried layer is located at a bottom of the doped layer. The second conductive type base region is formed in the doped layer. The second conductive type doped island is formed on a peripheral side of the base region, and a doping concentration of the doped island is greater than that of the base region. The first conductive type collector region is formed in the doped layer, and the collector region is spaced from the base region. The first conductive type emitter region is formed in the base region.

In an embodiment, the doping concentration of the base region ranges from $5e17 \text{ cm}{-3}$ to $8e17 \text{ cm}{-3}$, and the doping concentration of the doped island is greater than or equal to $5e18 \text{ cm}{-3}$.

In an embodiment, the doping concentration of the isolation buried layer ranges from $1e17 \text{ cm}{-3}$ to $3e17 \text{ cm}{-3}$, a doping concentration of the doped layer ranges from $1e16 \text{ cm}{-3}$ to $4e16 \text{ cm}{-3}$, a doping concentration of the collector region ranges from $1e17 \text{ cm}{-3}$ to $5e17 \text{ cm}{-3}$, and a doping concentration of the emitter region ranges from $1e17 \text{ cm}{-3}$ to $5e17 \text{ cm}{-3}$.

In an embodiment, a second conductive type contact region is formed in the base region. A doping concentration of the second conductive type contact region is greater than that of the doped island. A first conductive type contact region is formed in the collector region, and a doping concentration of the first conductive type contact region is greater than that of the collector region.

In an embodiment, a bottom of the collector region is connected to at least a portion of the isolation buried layer, and a bottom of the doped island is connected to at least a portion of the isolation buried layer.

In an embodiment, a doping concentration of the collector region is greater than that of the doped layer, and a doping concentration of the isolation buried layer is greater than that of the doped layer.

In an embodiment, an injection junction depth of the base region is less than or equal to that of the doped island.

In an embodiment, the base region is formed in an upper surface layer of the doped layer, and the base region is surrounded by an enclosing structure formed by the doped island and the isolation buried layer.

BRIEF DESCRIPTION OF THE DRAWINGS

FIG. 7 shows a schematic diagram of the structure of the super-$\beta$ bipolar junction transistor according to an embodiment of the present disclosure.

DETAILED DESCRIPTION OF THE EMBODIMENTS

Figure 1:
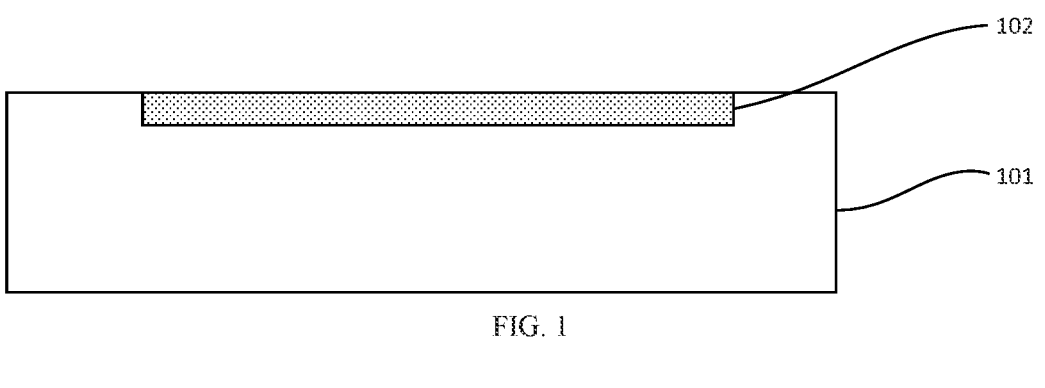
FIGS. 1 to 7 are schematic diagrams of structures presented in steps of a method for manufacturing a super-$\beta$ bipolar junction transistor according to an embodiment of the present disclosure.

Embodiments of the present disclosure will be described below by specific examples, and other advantages and effects of the present disclosure can be readily understood by those skilled in the art according to the contents disclosed in this specification. The present disclosure may also be implemented or applied by other different specific embodiments, and the details of this specification may be modified or changed in various ways based on different views and applications without departing from the spirit of the present disclosure.

In order to facilitate illustration, when detailing the embodiments of the present disclosure, the cross-sectional view indicating the structure of the device will be locally enlarged not in accordance with the general scale. The schematic diagram is only an example, which should not limit the scope of protection of the present disclosure. In addition, the three-dimensional spatial dimensions including the length, width and depth should be included in the actual manufacturing.

The spatial relationship terms such as "under", "below", "lower", "beneath", "above", "on", etc., may be used herein for convenience of description to describe the relationship of one element or feature to other elements or features shown in the figures. It will be understood that the spatial relationship terms are intended to encompass different orientations of the device in use and operation in addition to the orientation shown in the figures. In addition, when a layer is referred to as being "between" two layers, it may be the only layer between the two layers, or there may be one or more layers therebetween.

In the context of the present disclosure, a described structure with a first feature "on top" of a second feature may include embodiments in which the first feature and the second feature are formed in direct contact or may include embodiments in which additional features are formed between the first feature and the second feature such that the first feature and the second feature may not be in direct contact.

It should be noted that the figures provided in this embodiment only schematically illustrate the basic idea of the present disclosure, therefore, only the components related to the disclosure are shown in the figures. The figures are not drawn in accordance with the number, shape, and size of the components as they are actually implemented. The shape, number, and proportion of the components in the actual implementation may be changed at will, and the layout of the components may be more complex.

In order to reduce a base recombination, ensure a sufficient base transport factor, and improve a common emitter current gain, the existing bipolar junction transistor usually pursues a shallower base region as well as a lower doping concentration of the base region, which may lead to a great risk of base region punch-through in the bipolar junction transistor. In addition, since the uniformly distributed base region concentration in a lateral direction (the direction of the width of the conducting channel) may lead to leakage currents in the non-working base region of the lateral NPN, the existing bipolar junction transistor also has the disadvantages such as a low injection efficiency of the emitter junction, a large leakage current, and a small current gain, etc. In the present disclosure, a doped island 105 is formed by a high concentration of ion injection on a peripheral side of a base region 104. A doping concentration of the doped island 105 is greater than that of the base region 104, and a concentration gradient is formed between the doped island 105 and the base region 104. The doped island 105 contributes to the bottom lateral depletion and the fast clip-off at the bottom of the base region, and reduces the recombination in the base region while keeping the base region from being punched-through, thereby increasing the common emitter current gain. In addition, due to the existence of the doped island 105, the non-working base region has a high P-type concentration, greatly reducing the current leakage of the lateral NPN, thus allowing the device to produce a high current gain.

To solve the above problems, as shown in FIGS. 1 to 7, this embodiment provides a method for manufacturing a super-$\beta$ bipolar junction transistor. The method includes the following steps.

As shown in FIG. 1, step 1) is first performed to provide a substrate 101 and form a first conductive type isolation buried layer 102 in the substrate 101.

As an example, the substrate 101 may be a semiconductor substrate, such as a Si substrate, a Ge substrate, a SiGe substrate, a SOI (silicon on insulator) or a GOI (germanium on insulator), etc. In other embodiments, the semiconductor substrate may also be a substrate including other elemental semiconductors or compound semiconductors, such as GaAs, InP, or SiC, etc. The semiconductor substrate may also be a stacked structure, such as Si/SiGe, etc. The semiconductor substrate may also be other epitaxial structures, such as SGOI (silicon germanium on insulator), etc. In this embodiment, the substrate is the Si substrate.

As an example, the first conductive type isolation buried layer 102 can be formed in the substrate 101 by an ion implantation process and an annealing process. In this embodiment, the doping concentration of the isolation buried layer 102 ranges from 1e17 cm$^{-3}$ to 3e17 cm$^{-3}$.

Figure 2:
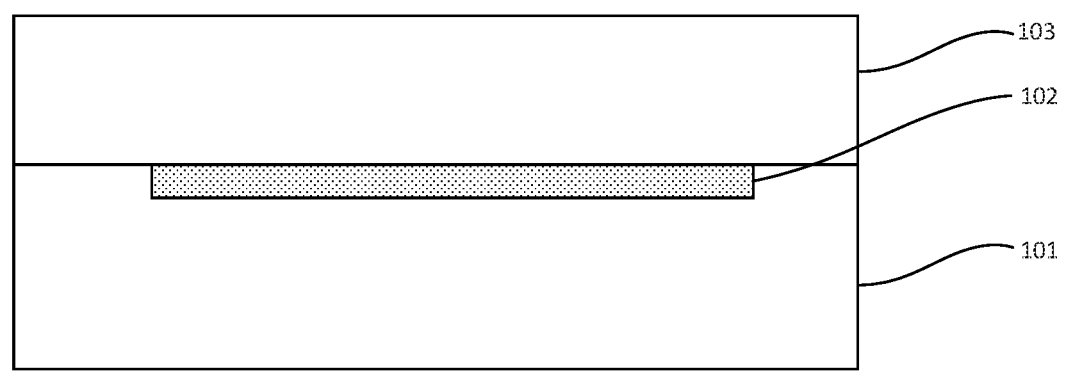

As shown in FIG. 2, step 2) is then performed to form a first conductive type doped layer 103 on the substrate 101, and the isolation buried layer 102 is located at the bottom of the doped layer 103.

As an example, the first conductive type doped layer 103 can be formed on the substrate 101 by a vapor phase epitaxy process. In an embodiment, a material of the doped layer 103 is chosen to be the same as the substrate 101. In this embodiment, the material of the doped layer 103 is Si.

The doping concentration of the doped layer 103 may range from 1e16 cm$^{-3}$ to 4e16 cm$^{-3}$. In a practical application, the doping concentration of the doped layer 103 is 2e16 cm$^{-3}$. An on-resistance and a breakdown voltage of a device can be effectively adjusted by adjusting the doping concentration of the doped layer 103 to meet the performance requirements of different devices.

In another embodiment, the isolation buried layer 102 may be formed first in the substrate by the ion implantation process, and then the doped layer 103 is formed on a surface of the substrate by the ion implantation process. The isolation buried layer 102 is located at the bottom of the doped layer 103 by controlling a depth of the isolation buried layer 102.

Figure 3:
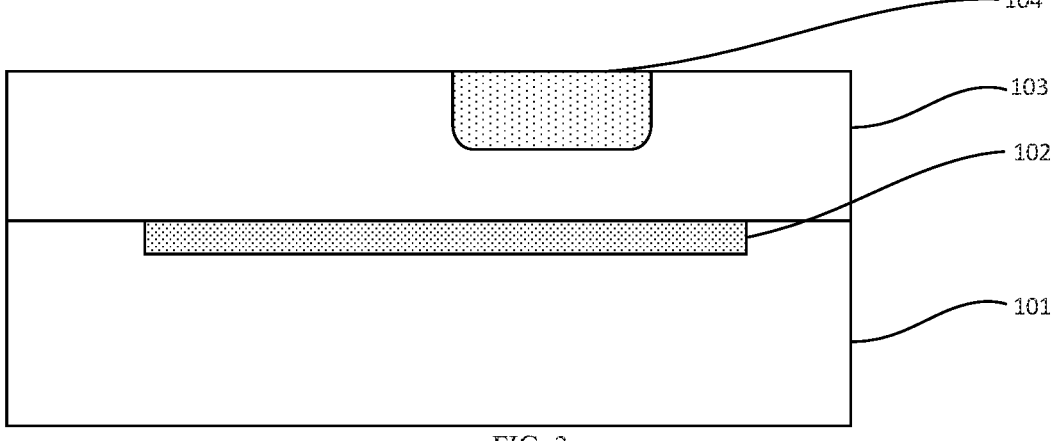

As shown in FIG. 3, step 3) is then performed to form a second conductive type base region 104 in the doped layer 103.

For example, the second conductive type base region 104 can be formed in the doped layer 103 by a photolithography process, an ion implantation process, and an annealing process. The doping concentration of the base region 104 may range from 5e17 cm$^{-3}$ to 8e17 cm$^{-3}$. In a practical application, the doping concentration of the base region 104 is 6e17 cm$^{-3}$. The base region 104 in this embodiment has a lower doping concentration, i.e., the doping concentration of the base region 104 is further reduced and lower than a conventional doping concentration of the base region, which can reduce the risk of the base region punch-through and shield the current leakage of the lateral non-working base region while effectively reducing the recombination in the base region 104 and ensuring the sufficient transport factor of the base region 104, thus better achieving a balance among the sufficient transport factor of the base region 104, the reduction of the risk of base region punch-through, and the shielding of the current leakage of the lateral non-working base region.

Figure 4:
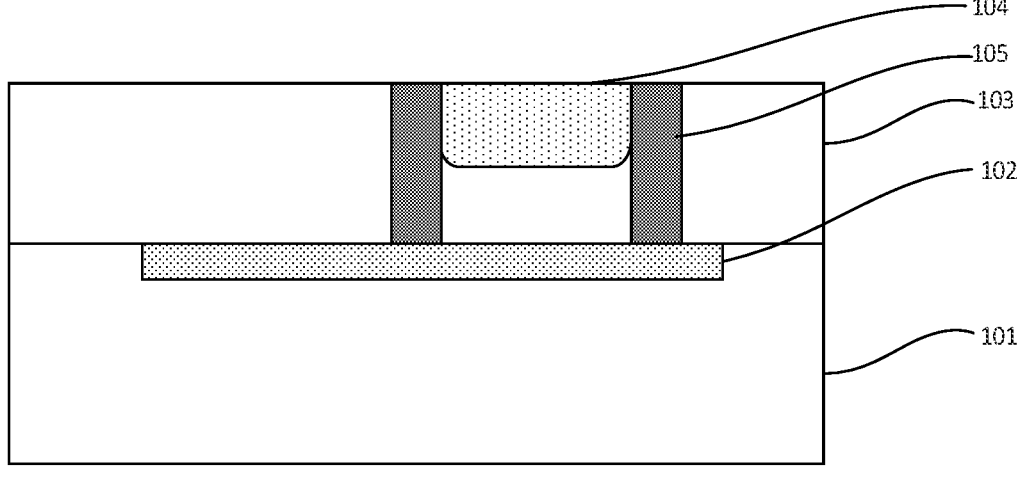

As shown in FIG. 4, step 4) is then performed to form a second conductive type doped island 105 on a peripheral side of the base region 104, and the doping concentration of the doped island 105 is greater than that of the base region 104. The bottom of the doped island 105 is connected to at least a portion of the isolation buried layer 102.

In this embodiment, an injection junction depth of the base region 104 is less than or equal to that of the doped island 105. The base region 104 is formed in an upper surface layer of the doped layer 103. The base region 104 is surrounded by an enclosing structure formed by the doped island 105 and the isolation buried layer 102.

For example, the second conductive type doped island 105 can be formed on the peripheral side of the base region 104 by a photolithography process, an ion implantation process, and an annealing process. The doping concentration of the doped island 105 is greater than that of the base region 104. In this embodiment, the doping concentration of the doped island 105 is greater than or equal to 5e18 cm$^{-3}$, for example, it may range from 8e18 cm$^{-3}$ to 9e18 cm$^{-3}$. In the present disclosure, the doped island 105 is formed by a high concentration of ion injection on the peripheral side of the base region 104. A concentration gradient is formed between the high concentration of the doped island 105 and the low concentration of the base region 104. The doped island 105 contributes to the bottom lateral depletion and the fast clip-off at the bottom of the base region, and reduces recombination in the base region while keeping the base region from being punched-through, thereby increasing the common emitter current gain. In addition, due to the existence of the doped island 105, the P-type concentration of the non-working base region is high, greatly reducing the current leakage of the lateral NPN, thus allowing the device to produce a high current gain.

Figure 5:
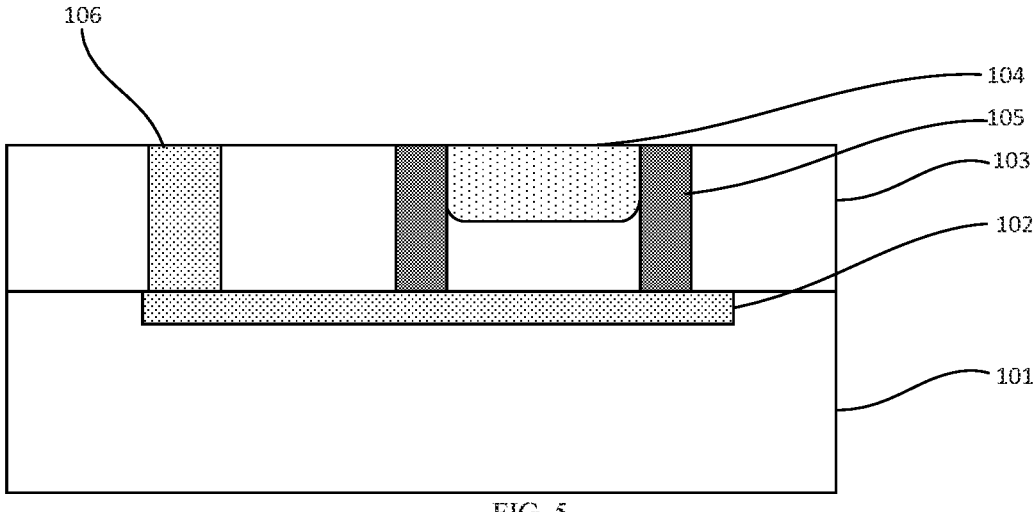

As shown in FIG. 5, step 5) is then performed to form a first conductive type collector region 106 in the doped layer 103, and the collector region 106 is spaced from the base region 104.

For example, the first conductive type collector region 106 can be formed in the doped layer 103 by a photolithography process, an ion implantation process, and an annealing process. The collector region 106 is spaced from the base region 104, while the bottom of the collector region 106 is at least connected to a portion of the isolation buried layer 102. As an example, the doping concentration of the collector region 106 ranges from 1e17 cm$^{-3}$ to 5e17 cm$^{-3}$. In a practical application, the doping concentration of the collector region 106 is 3e17 cm$^{-3}$.

Figures 6, 7:
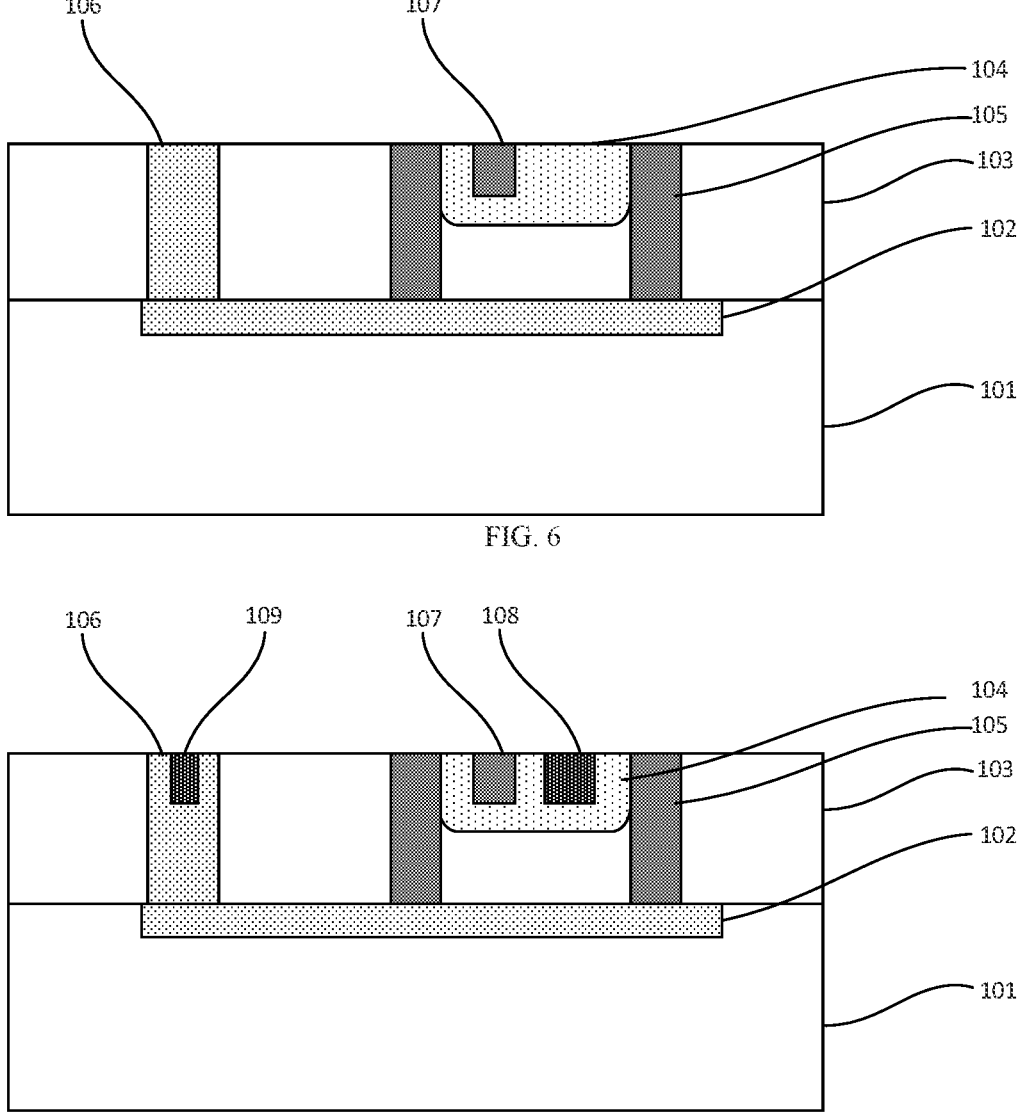

As shown in FIG. 6, step 6) is then performed to form a second conductive type contact region 107 in the base region 104, and the doping concentration of the second conductive type contact region 107 is greater than that of the doped island 105, thus reducing the contact resistance of the base region 104.

As shown in FIG. 7, step 7) is finally performed to form a first conductive type emitter region 108 in the base region 104.

For example, the first conductive type emitter region 108 can be formed in the base region 104 by a photolithography process, an ion implantation process, and an annealing process. The doping concentration of the emitter region 108 ranges from 1e17 cm$^{-3}$ to 5e17 cm$^{-3}$. In a practical application, the doping concentration of the emitter region 108 is 5e17 cm$^{-3}$. In this step, a first conductive type contact region 109 is further formed in the collector region 106. The doping concentration of the first conductive type contact region 109 is greater than that of the collector region 106. As an example, the first conductive type emitter region 108 and the first conductive type contact region 109 can be formed in a same doping step, i.e., the first conductive type emitter region 108 and the first conductive type contact region 109 are formed simultaneously by only one lithography process, ion implantation process, and annealing process, thereby reducing the cost of the process, and improving the efficiency of the process. In other embodiments, the collector region 106, the base region 104, and the emitter region 108 all lead out to the surface of the substrate. The lead-out methods include, but are not limited to, injection of a contact region, leading a doped region out, or use of through holes.

In this embodiment, the first conductive type is N-type, and the second conductive type is P-type. In other embodiments, the first conductive type may also be P-type, and the second conductive type may also be N-type.

As shown in FIG. 7, a super-β bipolar junction transistor is further provided by this embodiment. The super-β bipolar junction transistor includes a substrate 101, an isolation buried layer 102, a first conductive type doped layer 103, a second conductive type base region 104, a second conductive type doped island 105, a first conductive type collector region 106, and a first conductive type emitter region 108. The isolation buried layer 102 is formed in the substrate 101. The first conductive type doped layer 103 is formed in a surface layer of the substrate 101, or on the substrate 101. The isolation buried layer 102 is located at the bottom of the doped layer 103. The second conductive type base region 104 is formed in the doped layer 103. The second conductive type doped island 105 is formed on a peripheral side of the base region 104. The doping concentration of the doped island 105 is greater than that of the base region 104. The first conductive type collector region 106 is formed in the doped layer 103, and the collector region 106 is spaced from the base region 104. The first conductive type emitter region 108 is formed in the base region 104.

As an example, the substrate 101 may be a semiconductor substrate, such as a Si substrate, a Ge substrate, a SiGe substrate, a SOI (silicon on insulator) or a GOI (germanium on insulator), etc. In other embodiments, the semiconductor substrate may also be a substrate including other elemental semiconductors or compound semiconductors, such as GaAs, InP, or SiC, etc. The semiconductor substrate may also be a stacked structure, such as Si/SiGe, etc. The semiconductor substrate may also be other epitaxial structures, such as SGOI (silicon germanium on insulator), etc. In this embodiment, the substrate is the Si substrate.

As an example, the doping concentration of the doped layer 103 may range from $1e16$ cm$^{-3}$~$4e16$ cm$^{-3}$. In a practical application, the doping concentration of the doped layer 103 is $2e16$ cm$^{-3}$. An on-resistance and a breakdown voltage of a device can be effectively adjusted by adjusting the doping concentration of the doped layer 103 to meet the performance requirements of different devices.

As an example, the doping concentration of the base region 104 may range from $5e17$ cm$^{-3}$ to $8e17$ cm$^{-3}$. In a practical application, the doping concentration of the base region 104 is $6e17$ cm$^{-3}$. The base region 104 in this embodiment has a lower doping concentration, i.e., the doping concentration of the base region 104 is further reduced and lower than a conventional doping concentration of the base region, which can effectively reduce the recombination in the base region 104, reduce the risk of the base region punch-through while ensuring the sufficient transport factor of the base region 104, and shield the current leakage of the lateral non-working base region, thus better achieving a balance among the sufficient transport factor of the base region 104, the reduction of the risk of base region punch-through, and the shielding of the current leakage of the lateral non-working base region.

In this embodiment, the doped concentration of the doped island 105 is greater than or equal to $5e18$ cm$^{-3}$, such as ranging from $8e18$ cm$^{-3}$ to $9e18$ cm$^{-3}$. In the present disclosure, the doped island 105 is formed by a high concentration of ion injection on the peripheral side of base region 104. A concentration gradient is formed between the high concentration of the doped island 105 and the low concentration of the base region 104. The doped island 105 contributes to the bottom lateral depletion and the fast clip-off at the bottom of the base region, and reduces the recombination in the base region while keeping the base region from being punched-through, thereby increasing the common emitter current gain. In addition, due to the existence of the doped island 105, the P-type concentration of the non-working base region is high, greatly reducing the current leakage of the lateral NPN, thus allowing the device to produce a high current gain.

In this embodiment, the injection junction depth of the base region 104 is less than or equal to that of the doped island 105. The base region 104 is formed in an upper surface layer of the doped layer 103. The base region 104 is surrounded by an enclosing structure formed by the doped island 105 and the isolation buried layer 102.

As an example, the doping concentration of the isolation burled layer 102 ranges from $1e17$ cm$^{-3}$ to $3e17$ cm$^{-3}$. The doping concentration of the collector region 106 ranges from $1e17$ cm$^{-3}$ to $5e17$ cm$^{-3}$. In a practical application, the doping concentration of the collector region 106 is $3e17$ cm$^{-3}$. The doping concentration of the emitter region 108 ranges from $1e17$ cm$^{-3}$ to $5e17$ cm$^{-3}$. In a practical application, the doping concentration of the emitter region 108 is $5e17$ cm$^{-3}$.

In this embodiment, a second conductive type contact region 107 is further formed in the base region 104. The doping concentration of the second conductive type contact region 107 is greater than that of the doped island 105. A first conductive type contact region 109 is formed in the collector region 106. The doping concentration of the first conductive type of contact region 109 is greater than that of the collector region 106.

In this embodiment, the bottom of the collector region 106 is connected to at least a portion of the isolation buried layer 102, and the bottom of the doped island 105 is connected to at least a portion of the isolation buried layer 102.

In this embodiment, the first conductive type is N-type, and the second conductive type is P-type. In other embodiments, the first conductive type may also be P-type, and the second conductive type may also be N-type.

As described above, the super-$\beta$ bipolar junction transistor and the manufacturing method therefor provided by the present disclosure have the following beneficial effects.

In the present disclosure, the doped island 105 is formed by a high concentration of ion injection on the peripheral side of the base region 104. The doping concentration of the doped island 105 is greater than that of the base region 104, and a concentration gradient is formed between the doped island 105 and the base region 104. The doped island 105 contributes to the bottom lateral depletion and the fast clip-off at the bottom of the base region, and reduces the recombination in the base region while keeping the base region from being punched-through, thereby increasing the common emitter current gain. In addition, due to the existence of the doped island 105, the P-type concentration of the non-working base region is high, greatly reducing the current leakage of the lateral NPN, thus allowing the device to produce a high current gain.

The super-$\beta$ bipolar junction transistor provided by the present disclosure can effectively reduce the longitudinal electric field of the base region 104, reduce the lateral current leakage of the device, and better achieve the balance between prevention of punch-through of the base region 104 and an increase in a current amplification coefficient.

Therefore, the present disclosure effectively overcomes many disadvantages of the prior art and has a high industrial use value.

The above embodiments are merely exemplary to illustrate the principles and benefits of the present disclosure but are not intended to limit the disclosure. Any person skilled in the art may modify or change the above embodiments without violating the spirit and scope of the present disclosure. Therefore, all equivalent modifications or alterations made by a person with ordinary knowledge in the art without departing from the spirit and technical ideas revealed by the present disclosure shall still be covered by the claims of the present disclosure.

What is claimed is:

1. A method for manufacturing a super-β bipolar junction transistor, comprising:

providing a substrate, forming a first conductive type isolation buried layer and a first conductive type doped layer based on the substrate, the isolation buried layer being located at a bottom of the doped layer;

forming a second conductive type base region in the doped layer;

forming a second conductive type doped island on a peripheral side of the base region, a doping concentration of the doped island being greater than that of the base region;

forming a first conductive type collector region in the doped layer, the collector region being spaced from the base region; and forming a first conductive type emitter region in the base region.

2. The method for manufacturing the super-β bipolar junction transistor according to claim 1, wherein the doping concentration of the base region ranges from 5e17 cm$^{-3}$ to 8e17 cm$^{-3}$, and the doping concentration of the doped island is greater than or equal to 5e18 cm$^{-3}$.

3. The method for manufacturing the super-β bipolar junction transistor according to claim 1, wherein a doping concentration of the collector region is greater than that of the doped layer, and a doping concentration of the isolation buried layer is greater than that of the doped layer.

4. The method for manufacturing the super-β bipolar junction transistor according to claim 1, wherein an injection junction depth of the base region is less than or equal to that of the doped island.

5. The method for manufacturing the super-β bipolar junction transistor according to claim 1, further comprising:

forming a second conductive type contact region in the base region, and forming a first conductive type contact region in the collector region, a doping concentration of the second conductive type contact region being greater than that of the doped island, and a doping concentration of the first conductive type contact region being greater than that of the collector region.

6. The method for manufacturing the super-β bipolar junction transistor according to claim 1, wherein a bottom of the collector region is connected to at least a portion of the isolation buried layer, and a bottom of the doped island is connected to at least a portion of the isolation buried layer.

7. The method for manufacturing the super-β bipolar junction transistor according to claim 1, wherein the forming the first conductive type isolation buried layer and the first conductive type doped layer based on the substrate comprises:

forming the isolation buried layer in the substrate by an ion implantation process, and forming the doped layer in a surface layer of the substrate by an ion implantation process.

8. The method for manufacturing the super-β bipolar junction transistor according to claim 1, wherein the forming the first conductive type isolation buried layer and the first conductive type doped layer based on the substrate comprises:

forming the isolation buried layer in a surface layer of the substrate by an ion implantation process, and forming the doped layer on the substrate by an epitaxial process.

9. A super-β bipolar junction transistor, comprising:

a substrate, a first conductive type isolation buried layer being formed in the substrate;

a first conductive type doped layer being formed in a surface layer of the substrate or on the substrate, the isolation buried layer being located at a bottom of the doped layer;

a second conductive type base region being formed in the doped layer;

a second conductive type doped island being formed on a peripheral side of the base region, a doping concentration of the doped island being greater than that of the base region;

a first conductive type collector region being formed in the doped layer, the collector region being spaced from the base region; and a first conductive type emitter region being formed in the base region.

10. The super-β bipolar junction transistor according to claim 9, wherein the doping concentration of the base region ranges from 5e17 cm$^{-3}$ to 8e17 cm$^{-3}$, and the doping concentration of the doped island is greater than or equal to 5e18 cm$^{-3}$.

11. The super-β bipolar junction transistor according to claim 9, wherein the doping concentration of the isolation buried layer ranges from 1e17 cm$^{-3}$ to 3e17 cm$^{-3}$, a doping concentration of the doped layer ranges from 1e16 cm$^{-3}$ to 4e16 cm$^{-3}$, a doping concentration of the collector region ranges from 1e17 cm$^{-3}$ to 5e17 cm$^{-3}$, and a doping concentration of the emitter region ranges from 1e17 cm$^{-3}$ to 5e17 cm$^{-3}$.

12. The super-β bipolar junction transistor according to claim 9, wherein a second conductive type contact region is formed in the base region, a doping concentration of the second conductive type contact region being greater than that of the doped island, a first conductive type contact region is formed in the collector region, and a doping concentration of the first conductive type contact region being greater than that of the collector region.

13. The super-β bipolar junction transistor according to claim 9, wherein a bottom of the collector region is connected to at least a portion of the isolation buried layer, and a bottom of the doped island is connected to at least a portion of the isolation buried layer.

14. The super-β bipolar junction transistor according to claim 9, wherein a doping concentration of the collector region is greater than that of the doped layer, and a doping concentration of the isolation buried layer is greater than that of the doped layer.

15. The super-β bipolar junction transistor according to claim 9, wherein an injection junction depth of the base region is less than or equal to that of the doped island.

16. The super-β bipolar junction transistor according to claim 9, wherein the base region is formed in an upper surface layer of the doped layer, and the base region is surrounded by an enclosing structure formed by the doped island and the isolation buried layer.

* * * * *